(12) United States Patent  
Qi

(10) Patent No.: US 9,185,821 B2  
(45) Date of Patent: Nov. 10, 2015

(54) BRACKET AND ELECTRONIC DEVICE HAVING THE SAME

(71) Applicants: Beijing Lenovo Software LTD., Beijing (CN); Lenovo (Beijing) Limited, Beijing (CN)

(72) Inventor: Yue Qi, Beijing (CN)

(73) Assignees: Beijing Lenovo Software Ltd., Beijing (CN); Lenovo (Beijing) Limited, Beijing (CN)

(*) Notice: Subject to any disclaimer, the term of this patent is extended or adjusted under 35 U.S.C. 154(b) by 152 days.

(21) Appl. No.: 13/940,624

(22) Filed: Jul. 12, 2013

(65) Prior Publication Data

US 2014/0016252 A1 Jan. 16, 2014

(30) Foreign Application Priority Data

Jul. 16, 2012 (CN) .............................. 201210245828

(51) Int. Cl.
*H05K 5/00* (2006.01)
*H05K 7/14* (2006.01)
*G06F 1/16* (2006.01)

(52) U.S. Cl.
CPC ................ *H05K 7/14* (2013.01); *G06F 1/1616* (2013.01); *G06F 1/1624* (2013.01); *G06F 1/1679* (2013.01)

(58) Field of Classification Search
CPC ... G06F 1/1616; G06F 1/1681; G06F 1/1679; Y10S 248/919; Y10S 248/923

USPC .............. 361/679.27, 679.2, 679.12, 679.06, 361/679.01, 679.02

See application file for complete search history.

(56) References Cited

U.S. PATENT DOCUMENTS 6,288,891 B1 * 9/2001 Hasegawa et al. ....... 361/679.07
2011/0156562 A1 * 6/2011 Wu et al. ....................... 312/323

* cited by examiner

*Primary Examiner* — Robert J Hoffberg
*Assistant Examiner* — Hung Dang
(74) *Attorney, Agent, or Firm* — Westman, Champlin & Koehler, P.A.

(57) ABSTRACT

The present invention discloses a bracket for an electronic device comprising a first shell at least including a first track and a second shell at least including a second track, the bracket being adapted to connect the first shell with the second shell The bracket comprises a first shaft adapted to be connected with the first shell and movable along the first track and a second shaft adapted to be connected with the second shell and movable along the second track. The present invention also discloses electronic device comprising a first shell at least including a first track and a second shell at least including a second track, and a bracket being adapted to connect the first shell with the second shell, wherein the bracket comprises a first shaft adapted to be connected with the first shell and movable along the first track and a second shaft adapted to be connected with the second shell and movable along the second track.

9 Claims, 3 Drawing Sheets

BRACKET AND ELECTRONIC DEVICE HAVING THE SAME

CROSS-REFERENCE TO RELATED APPLICATION

This Application claims priority to Chinese patent application no. 201210245828.4, filed Jul. 16, 2012, in Chinese, the contents of which are hereby incorporated by reference in their entirety.

BACKGROUND OF THE INVENTION

1. Field of the Invention

The present invention generally relates to a field of computer device, and in particular, to a bracket and an electronic device having the same.

2. Description of the Related Art

With the rapid development of computer devices, computers become much lighter, more portable and have better performance for purpose of bringing better experience for users. Conventional bracket structure for the notebook computer is configured to allow the notebook to be closed down as a tablet computer, which enhances portability of the computer. By means of the bracket structure, the notebook computer can be opened up when required. The bracket structure comprises two shafts, the upper one and the lower one. With rotations of both the upper and lower shafts, the notebook computer can transform between in a tablet computer mode and in an open up mode in which first and second shells of the notebook computer can be rotated within a range of 180 degree, which facilitates use of the notebook However, it has been found the above technique at least has the following technical problems.

Firstly, both the upper and lower shafts of the bracket structure cannot rotate as they both are fixed on the shell of the notebook computer, and, the first shell of the notebook computer containing therein the display cannot be raised up when the notebook computer is placed in a lower location, which causes inconvenience to user.

Secondly, both the upper and lower shafts of the bracket structure cannot move as they both are fixed on the shell of the notebook computer, and, the first shell of the notebook computer containing therein the display cannot be moved in a horizontal direction when the notebook computer is placed in a relatively remote location, which shortens the distance between the first shell and the user, thus causing inconvenience to user.

SUMMARY OF THE INVENTION

The present invention has been made to solve at least one of these technical problems existing in the prior art. The present invention aims to provide a bracket and electronic device in which upper and lower shafts of the bracket are movable in certain range such that a shell including a display unit, of the electronic device, is movable along both a vertical direction and a horizontal direction. With this configuration, it not only provides convenience to user, but also improves the user's experience.

The present invention provides a bracket for an electronic device, in one embodiment, and, the electronic device comprises a first shell at least including a first track and a second shell at least including a second track, the bracket is adapted to connect the first shell with the second shell, wherein the bracket comprises a first shaft adapted to be connected with the first shell and movable along the first track and a second shaft adapted to be connected with the second shell and movable along the second track.

In an alternative embodiment, the bracket further comprises a first connection member having a first end rotatably connected with the first shaft and a second end rotatably connected with the second shaft.

In an alternative embodiment, the first end of the first connection member comprises at least one first shaft sleeve configured that the first shaft is rotatable in the at least one first shaft sleeve and the second end comprises at least one second shaft sleeve configured that the first shaft is rotatable in the at least one second shaft sleeve.

In an alternative embodiment, the first shell is rotatable around the first shaft and the second shell is rotatable around the second shaft.

In an alternative embodiment, first sawtooth structures which are symmetric to each other are provided at both sides of the first track, respectively.

In an alternative embodiment, second sawtooth structures which are symmetric to each other are provided at both sides of the second track respectively such that the second shaft is fixable on the second sawtooth structures.

In an alternative embodiment, the first shell is able to be overlapped with or be away from the second shell, wherein the electronic device is at a tablet computer mode when the first shell is overlapped with the second shell, and the electronic device is at a notebook computer mode when the first shell is away from the second shell.

In an alternative embodiment, the first shell at least comprises a display unit and/or a processing unit, for displaying an operation object of the electronic device on the display unit.

In an alternative embodiment, the second shell at least comprises an input unit and/or a processing unit, for operating the electronic device by means of the input unit.

The present invention further provides an electronic device, in one embodiment, and, the electronic device comprises a first shell at least including a first track and a second shell at least including a second track and a bracket adapted to connect the first shell with the second shell, wherein the bracket comprises a first shaft adapted to be connected with the first shell and movable along the first track and a second shaft adapted to be connected with the second shell and movable along the second track.

Compared with the prior art, one or more technical solution(s) according to these embodiments of the present invention at least has one or more of the following technical benefits and advantages.

Firstly, since, according to embodiments of the present invention, the first shaft of the bracket is adapted to be connected with the first shell and movable along the first track and the second shaft of the bracket is adapted to be connected with the second shell and movable along the second track, the first shell is able to move both in the horizontal direction and in the vertical direction while keeping original functions of the electronic equipment on which the bracket is applied. This not only improves user experience but also facilitates convenient use of the computer device facilitates use of the computer device.

Secondly, since, according to embodiments of the present invention, the first sawtooth structure in a symmetry structure is provided at respective side of the first track and the second sawtooth structure in a symmetry structure is provided at respective side of the second track, the first shell is able to adjust the moving distances both in the horizontal direction and in the vertical direction while moving both in the horizontal direction and in the vertical direction. This not only further improves user experience but also facilitates convenient use of the computer device.

BRIEF DESCRIPTION OF THE DRAWINGS

These and/or other aspects and advantages of the invention will become apparent and more readily appreciated from the following description of the embodiments, taken in conjunction with the accompanying drawings of which.

Figure 1:
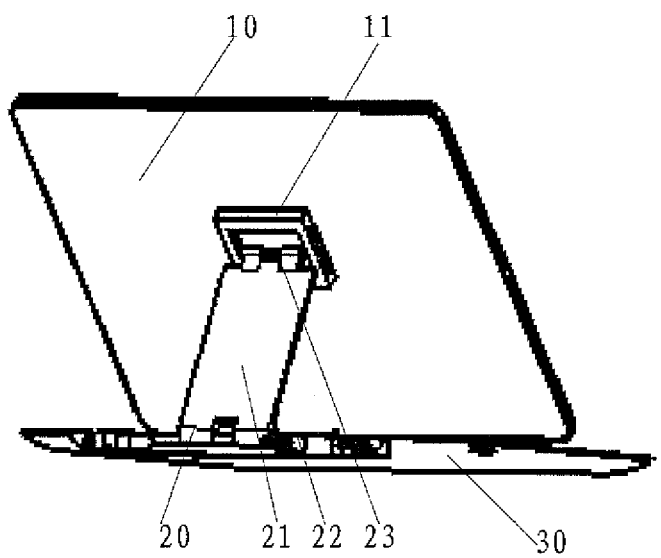
FIG. 1 is a structurally schematic view of a bracket for an electronic device, according to one embodiment of the present invention.

The scope of the present invention will in no way be limited to the simply schematic views of the drawings, the number of constituting components, the materials thereof, the shapes thereof, the relative arrangement thereof, etc., and are disclosed simply as an example of an embodiment.

DETAILED DESCRIPTION OF PREFERRED EMBODIMENTS OF THE INVENTION

Certain embodiments of the present invention will be described hereinafter in detail with reference to the attached drawings, wherein the like reference numerals refer to the like elements. The present invention may, however, be embodied in many different forms and should not be construed as being limited to the embodiment set forth herein; rather, these embodiments are provided so that the present invention will be thorough and complete, and will fully convey the concept of the invention to those skilled in the art.

In accordance with these embodiments of the present invention, to solve the problem existed in the prior art, i.e., the first shell of the electronic device cannot move neither in the horizontal direction nor in the vertical direction, which brings inconvenience to user and degrades user experience, a bracket and an electronic device are provided to not only improve user experience but also bring convenience to user.

General concept of the present invention aims to eliminate the above-mentioned inconvenience in use caused to user.

Generally, structures of the first and second shafts of the bracket is redesigned such that the first shaft is configured to be connected with the first shell and movable along the first track and a second shaft is used to be connected with the second shell and movable along the second track.

Since the first shaft is movable along the first track and the second shaft is movable along the second track, the first shell can move both in the horizontal direction and in the vertical direction. This not only facilitates convenient use of the computer device but also improves user experience.

In order to convey the above-mentioned technical solutions in a better manner, description in detail is made as follows by introducing specific embodiments taken in conjunction with the accompanying drawings.

Referring to FIG. 1, the present invention provides a bracket 21 for an electronic device, in one embodiment. The electronic device comprises a first shell 10 and a second shell 30, the bracket 21 is adapted to connect the first shell 10 with the second shell 30, the first shell 10 at least includes a first track 11, and, the bracket 21 comprises a first shaft 23 adapted f to be connected with the first shell 10 and movable along the first track 11.

Figure 2:
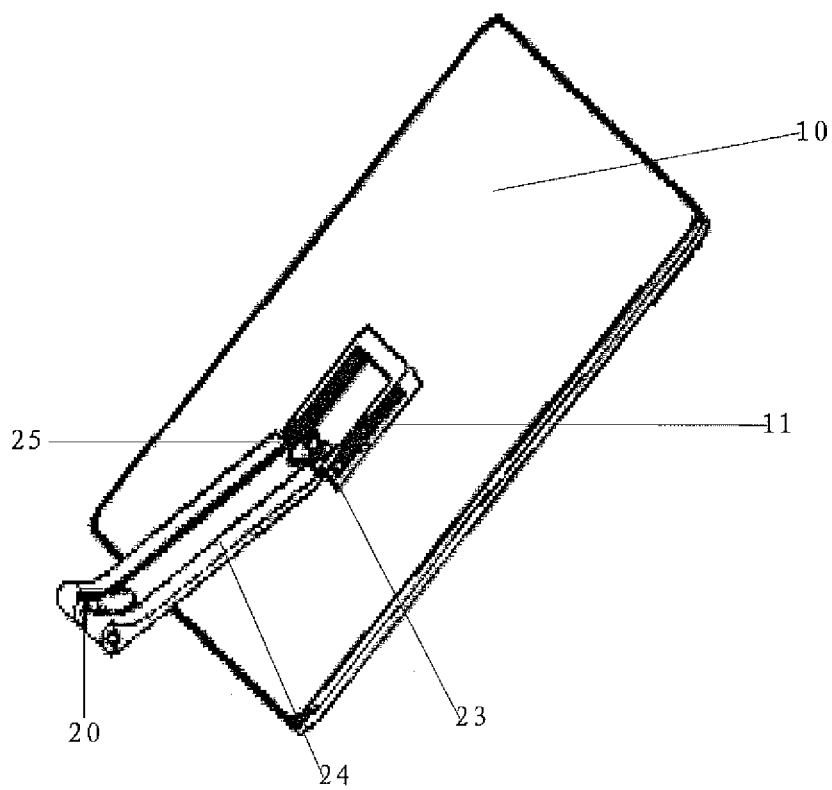
FIG. 2 is a structural view of a connection between the bracket and a first shell in FIG. 1.

Referring to FIG. 2, it is an enlarged view of a portion of the bracket 21 that is connected with the first shell 10, the bracket includes:
- the first shell 10;
- the first track 11, which is fixed on the first shell 10, and first sawtooth structures in a symmetry manner are provided at both sides of the first track 11;
- the first shaft 23, which is matched to the first track 11, and, which is engaged with the first track 11 and is movable along the first track 11;
- a first connection member 24, which has a first end 25 rotatably connected with the first shaft 23 and a second end 20 rotatably connected with a second shaft.

Figure 3:
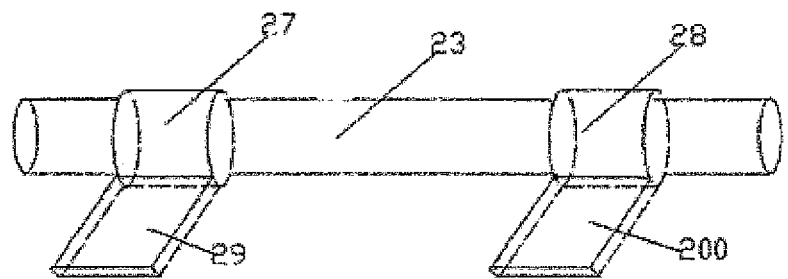
FIG. 3 is a structural view of a connection between a first end of a first connection member and a first shaft in FIG. 2.

Referring to FIG. 3, it is an enlarged view of a structure of connection between a first end of a first connection member and a first shaft in FIG. 2. The first end includes:
- a first shaft sleeve 27, which is fitted over the first shaft 23, and has the diameter slightly larger than that of the first shaft 23 so that the first shaft 23 is rotatable therein;
- a first shaft sleeve 28, which is fitted over the first shaft 23, and has the diameter slightly larger than that of the first shaft 23 so that the first shaft 23 is rotatable therein;
- a first shaft sleeve connection member 29, which is fixed on the outer surface of the first shaft sleeve 27 and is adapted to be brought to move once the first shaft 23 rotates;
- a first shaft sleeve connection member 200, which is fixed on the outer surface of the first shaft sleeve 28 and is adapted to be brought to move once the first shaft 23 rotates.

Moreover, a certain gap is provided between the first shaft sleeve connection member 29 and the first shaft sleeve connection member 200 which facilitates bringing the first connection member 24 to move once the first shaft 23 rotates. The number of the first shaft 23 is one, or three or more. However, it falls into the scope of the present invention despite of the number of the first shaft 23 may vary.

Figure 4:
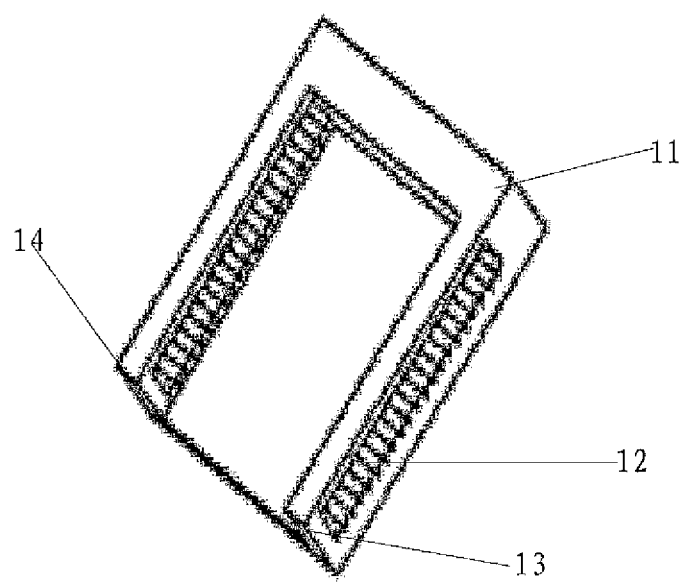
FIG. 4 is a structurally schematic view of a first track in FIG. 2.

Referring to FIG. 4, it is an enlarged view of the first track in FIG. 2. The first track 11 comprises:
- a first sawtooth structure 12, which includes several sawteeth disposed in a symmetrical manner at both sides of the first track 11 such that, the first shaft 23 is brought to be engaged into the first sawtooth structure 12 while bringing the first shaft 23 to move in the first track 11, to bring the first shell 10 to a desirable position for user by adjusting a moving distance of the first shell 10 in the vertical direction, so as to improve user experience;
- a first barrier 13 and a second barrier 14, adapted to limit a length of the first track 11, and used as barriers for preventing the first shaft 23 from being slipped off the first track 11, to ensure that the first shaft 23 slides only within the first track 11.

Particularly, the first barrier 13 and second barrier 14 are disposed at the same horizontal level such that these sawteeth of the sawtooth structure 12 are arranged symmetrically at both sides of the first track 11. However, the first barrier 13 and second barrier 14 may be not disposed at the same horizontal level, and can be designed in the other forms, which allows the first sawtooth structure 12 to be disposed at both sides of the first track 11 in a symmetrical manner.

Figure 5:
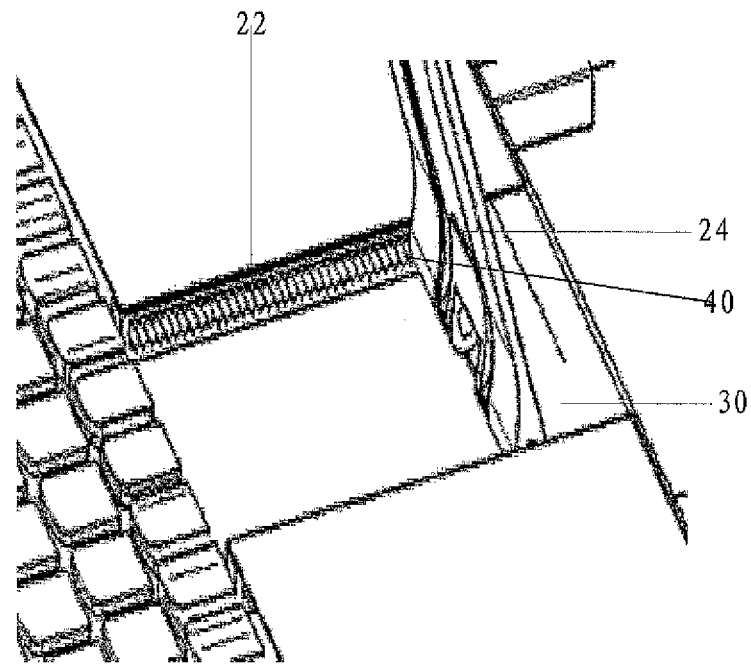
FIG. 5 is a structural view of a connection between the bracket and a second shell in FIG. 1.

Referring to FIG. 5, it is an enlarged view of a connection between the bracket and the second shaft in FIG. 1. It comprises:

- a second track 22, which is embedded in the second shell 30 for facilitating the sliding of the first connection member 24 on the second track 22, wherein the second track 22 has the same structure as that of the first track 11, a second sawtooth structure with sawteeth in a symmetrical manner is provided at both sides of said second track 22, and the length of the second track 22 is not greater than the width of a blank region of the electronic device having no keystrokes;
- a second shaft 40, which is adapted to be connected with the second shell 30 and movable along said second track 22, wherein the second shaft 40 is fixable in the second sawtooth structure for adjusting the moving distance of the first shell 10 in the horizontal direction.

Figure 6:
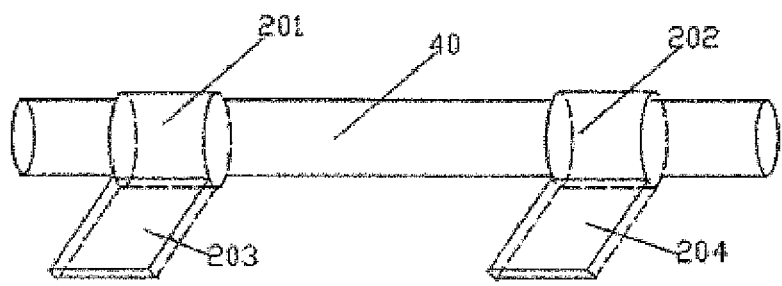
FIG. 6 is a structural view of a connection between a second end of a first connection member and a second shaft in FIG. 5.

Referring to FIG. 6, it is an enlarged view of a connection between the second end of a first connection member and the second shaft in FIG. 1. The second end comprises:

- a second shaft sleeve 201, which is fitted over on the second shaft 40, and has the diameter slightly larger than that of the second shaft 40 so that the second shaft 40 is rotatable therein;
- a second shaft sleeve 202, which is fitted over the second shaft 40, and has the diameter slightly larger than that of the second shaft 40 so that the second shaft 40 is rotatable therein;
- a second shaft sleeve connection member 203, which is fixed on the outer surface of the second shaft sleeve 201 and is adapted to be brought to move once the second shaft 40 rotates;
- a second shaft sleeve connection member 204, which is fixed on the outer surface of the second shaft sleeve 202 and is adapted to be brought to move once the second shaft 40 rotates.

Moreover, a certain gap is provided between the second shaft sleeve connection member 203 and the second shaft sleeve connection member 204 which facilitates bringing the first connection member 24 to move once the second shaft 40 rotates. The number of the second shaft 40 is one, or three or more. However, it falls into the scope of the present invention despite of the number of the second shaft 40 may vary.

In addition, the first shell 10 and the second shell 30 are connected by the bracket 21. Since the two shafts disposed on the bracket 21 are rotatable respectively in their corresponding tracks, rotations of the two shafts bring the bracket to move such that the first shell 10 can be overlapped with or away from the second shell 30. The electronic device is at a tablet computer mode when the first shell 10 is overlapped with the second shell 30, and the electronic device is at a notebook computer mode when the first shell 10 is away from the second shell 30.

Hereinafter the operation of the above-mentioned bracket will be explained in detail.

Based on scientific research on human visual perception, it facilitates convenient use of the computer device and better user experience when the electronic device stays in the same horizontal plane with the user's eyes. The first shell of the electronic device at least comprises a display unit and/or a processing unit, for displaying an operation object of the electronic device on the display unit so that the user can watch the displayed operation object easily. The second shell at least comprises an input unit and/or a processing unit, for operating the electronic device by means of the input unit. Once the first shell of the electronic device stays in a relatively lower or higher location relative to user, the electronic device can be brought to the same horizontal plane with the user's eyes by adjusting height of the first shell.

As shown in FIGS. 1 and 4, in the electronic device, the first shaft 23 of the bracket 21 is usually engaged in a first unit of symmetrical sawtooth, i.e., a unit mostly away from the barrier, of the first sawtooth structure 12. Once the first shell 10 is required to be brought to a higher location, the first shaft 23 is moved from the first unit of symmetrical sawtooth downwardly along the first track 11, to bring the first shell 10 to move upwardly and cause the first shell 10 to be separated from the second shell 30. And then, if the display unit on the first shell 10 stays in the same horizontal plane with the user's eyes, a first distance by which the first shaft 23 moves downwardly is determined and the first shaft 23 is engaged into a second unit of symmetrical sawtooth corresponding to the first distance. After the first shaft 23 is engaged into the second unit of symmetrical sawtooth, an angle of the first shell 10 is adjusted fore and aft by rotating the first shaft 23 and/or the second shaft 40, so as to achieve a suitable angle of the first shell 10, for user. This not only improves user experience but also facilitates convenient use of the computer device. Of course, in accordance with the length of the first track 11, it ensures that the adjustable distance of the first shell 10 in the vertical direction is not larger than the length of the first track 11.

Further, as shown in FIG. 3, after the first shaft 23 is engaged into the second unit of symmetrical sawtooth, the first shaft 23 and/or the second shaft 23 may be rotated. Once the first shaft 23 is rotated, the two first shaft sleeves are closely attached to the first shaft 23 since the diameters of the first shaft sleeve 27 and the first shaft sleeve 28 are slightly larger than that of the first shaft 23. During rotation of the first shaft 23, force is applied to the two first shaft sleeves. Once the two first shaft sleeves are applied with force, counterforces are acted respectively on the first shaft sleeve connection member 29 and the first shaft sleeve connection member 200 since the first shaft sleeve connection member 29 is fixed on the outer surface of the first shaft sleeve 27 and the first shaft sleeve connection member 200 is fixed on the outer surface of the first shaft sleeve 28. As both the first shaft sleeve connection member 29 and the first shaft sleeve connection member 200 are parts of the first connection member 24, counterforces bring the first connection member 24 to shift fore and aft, and accordingly the first shell is brought to shift fore and aft. As a result, when the first shell shifts fore and aft, the angle at which the first shell stays is much more accommodated to the user's view.

Based on scientific research on human visual perception, if there is suitable distance between the first shell of the electronic device and the user, the user will clearly watch the display object on the display unit of the first shell and it does not cause any harm to the user's eyes. If the distance between the first shell of the electronic device and the user is too large or too small, it may cause excessive use of eyes. Accordingly, the present invention allows to achieve suitable distance by adjusting the distance from the first shell of the electronic device to the user in the horizontal direction, such that the user will clearly watch the display object. This not only improves user experience but also facilitates convenient use of the computer device.

As shown in FIG. 5, in the electronic device, the second shaft 40 of the bracket 21 is usually engaged in a third unit of symmetrical sawtooth, i.e., a unit mostly away from the physical keyboard of the electronic device, of the second sawtooth structure. Once the first shell 10 is required to be in the horizontal direction, the second shaft 40 is moved from the third unit of symmetrical sawtooth along the second track 22, to bring the first shell 10 towards the end of the first shell 10 close to the physical keyboard, thus causing the first shell 10 to be closer to the user. If the distance of the first shell 10 moving in the horizontal direction has been adjusted to be a suitable distance between the first shell and the user, a second distance of the first shell 10 moving towards the end of the first shell 10 close to the physical keyboard will be determined and the second shaft 40 is engaged into a fourth unit of symmetrical sawtooth corresponding to the second distance. After the second shaft 40 is engaged into the fourth unit of symmetrical sawtooth, an angle of the first shell 10 is adjusted fore and aft by rotating the first shaft 23 and/or the second shaft 40, so as to achieve a suitable angle of the first shell 10, for user. This not only improves user experience but also facilitates convenient use of the computer device. Of course, in accordance with the length of the second track 22, it can be determined that the adjustable distance of the first shell 10 in the vertical direction is not larger than the length of the second track 2.

Further, as shown in FIG. 6, after the second shaft 40 is engaged into the fourth unit of symmetrical sawtooth, the second shaft 40 and/or the first shaft 23 may be rotated. Once the second shaft 40 is rotated, the two second shaft sleeves 201, 202 are closely attached to the second shaft 40 since the diameters of the second shaft sleeve 201 and the second shaft sleeve 202 are slightly larger than that of the second shaft 40. During rotation of the second shaft 40, the second shaft sleeve connection member 203 and the second shaft sleeve connection member 204 are forced by counterforces respectively. As both the second shaft sleeve connection member 203 and the second shaft sleeve connection member 204 are parts of the first connection member 24. Under the counterforces, the first connection member 24 is brought to shift fore and aft, the first shell is brought to shift fore and aft, and then, with the shifting fore and aft of the first shell, the angle at which the first shell stays is much more compliant with the user's view.

In addition, on the basis of the above-mentioned horizontal direction moving principle and vertical direction moving principle, once the first shell is required to move in the horizontal direction and in the vertical direction, the first shell is moved in the horizontal direction and in the vertical direction, respectively, to cause the first shell to stay in a most suitable location, so as to bring convenient operation to user. Once the angle from the first shell to the second shell is too great, the first shell and the second shell may be rotated to cause the first shell 10 to be overlapped with the second shell 30, so as to allow the electronic equipment to stay in a tablet computer mode.

On the basis of the above-mentioned bracket, the present invention also provide an electronic device comprising a first shell at least including a first track and a second shell at least including a second track, and a bracket adapted to connect the first shell with the second shell, wherein the bracket comprises a first shaft adapted to be connected with the first shell and movable along the first track and a second shaft adapted to be connected with the second shell and movable along the second track.

The bracket further comprises a first connection member having a first end rotatably connected with the first shaft and a second end rotatably connected with the second shaft. The angle between the first shell and the second shell is adjusted by rotatably connecting the first connection member with the first shaft and the second shaft so as to facilitate convenient use of the computer device.

The first end of the first connection member comprises at least one first shaft sleeve configured that the first shaft is rotatable in the at least one first shaft sleeve and the second end comprises at least one second shaft sleeve configured that the first shaft is rotatable in the at least one second shaft sleeve.

The first shell is rotatable around the first shaft and the second shell is rotatable around the second shaft.

A first sawtooth structure including first sawteeth in a symmetrical manner disposed at both sides of the first track is provided such that the first shaft is fixable on the first sawtooth structure. A second sawtooth structure including first sawteeth in a symmetrical manner disposed at both sides of the second track is provided such that the second shaft is fixable on the second sawtooth structure. The first shaft is fixable on each unit of the sawtooth in a symmetrical manner of the first sawtooth structure, such that the moving distance of the first shell in the vertical direction is controllable, which facilitates convenient use of the computer device. The second shaft is fixable on each unit of the sawtooth in a symmetrical manner of the second sawtooth structure, such that the moving distance of the second shell in the horizontal direction is controllable, which also facilitates convenient use of the computer device.

The first shell at least comprises a display unit and/or a processing unit, for displaying an operation object of the electronic device on the display unit. The second shell at least comprises an input unit and/or a processing unit, for operating the electronic device by means of the input unit. The first shell generally means that shell of the notebook computer mounted with the display, and the second shell generally means that shell of the notebook computer mounted with the physical keyboard.

The first shell is able to be overlapped with or be away from the second shell, wherein the electronic device is at a tablet computer mode when the first shell is overlapped with the second shell, and the electronic device is at a notebook computer mode when the first shell is away from the second shell.

The above-mentioned technical solution(s) according to these embodiments of the present invention at least has following technical benefits and advantages.

Firstly, since, according to embodiments of the present invention, the first shaft of the bracket is configured to be connected with the first shell and movable along the first track and the second shaft of the bracket is configured to be connected with the second shell and movable along the second track, the first shell is able to move both in the horizontal direction and in the vertical direction while keeping original functions of the electronic equipment on which the bracket is applied. This not only improves user experience but also facilitates convenient use of the computer device.

Secondly, since, according to embodiments of the present invention, the first sawtooth structure having symmetrical sawteeth is provided at both sides of the first track and the second sawtooth structure having symmetrical sawteeth is provided at both sides of the second track, the first shell is able to adjust the moving distances both in the horizontal direction and in the vertical direction while moving both in the horizontal direction and in the vertical direction. This not only further improves user experience but also facilitates convenient use of the computer device.

Although several exemplary embodiments have been shown and described, it would be appreciated by those skilled in the art that various changes or modifications may be made in these embodiments without departing from the principles and spirit of the invention, the scope of which is defined in the claims and their equivalents.

What is claimed is:

1. A bracket for an electronic device comprising a first shell at least including a first track and a second shell at least including a second track, said bracket being adapted to connect said first shell with said second shell, wherein said bracket comprises a first shaft adapted to be connected with said first shell and movable along said first track and a second shaft adapted to be connected with said second shell and movable along said second track and an integrally first connection member having a first end rotatably connected with said first shaft and a second end rotatably connected with said second shaft.

2. A bracket according to claim 1, wherein said first end of said first connection member comprises at least one first shaft sleeve configured that said first shaft is rotatable in said at least one first shaft sleeve and said second end comprises at least one second shaft sleeve configured that said second shaft is rotatable in said at least one second shaft sleeve.

3. A bracket according to claim 1, wherein said first shell is rotatable around said first shaft and said second shell is rotatable around said second shaft.

4. A bracket according to claim 1, wherein first sawtooth structures in a symmetrical manner are provided at both sides of said first track, respectively.

5. A bracket according to claim 1, wherein second sawtooth structures in a symmetrical manner are provided at both sides of said second track, respectively, such that said second shaft is fixable on said second sawtooth structures.

6. A bracket according to claim 1, wherein said first shell is able to be overlapped with or be away from said second shell, wherein the electronic device is at a tablet computer mode when said first shell is overlapped with said second shell, and the electronic device is at a notebook computer mode when said first shell is away from said second shell.

7. A bracket according to claim 1, wherein said first shell at least comprises a display unit and/or a processing unit, for displaying an operation object of the electronic device on said display unit.

8. A bracket according to claim 1, wherein said second shell at least comprises an input unit and/or a processing unit, for operating the electronic device by means of said input unit.

9. An electronic device, comprising a first shell at least including a first track and a second shell at least including a second track, and a bracket being adapted to connect said first shell with said second shell, wherein said bracket comprises a first shaft adapted to be connected with said first shell and movable along said first track and a second shaft adapted to be connected with said second shell and movable along said second track and an integrally first connection member having a first end rotatably connected with said first shaft and a second end rotatably connected with said second shaft.

* * * * *